United States Patent
Bois et al.

(10) Patent No.: US 11,136,665 B2
(45) Date of Patent: Oct. 5, 2021

(54) SHADOW RING FOR MODIFYING WAFER EDGE AND BEVEL DEPOSITION

(71) Applicant: Applied Materials, Inc., Santa Clara, CA (US)

(72) Inventors: Dale Du Bois, Los Gatos, CA (US); Mohamad A. Ayoub, Los Gatos, CA (US); Robert Kim, San Francisco, CA (US); Amit Kumar Bansal, Milpitas, CA (US); Mark Fodor, Los Gatos, CA (US); Binh Nguyen, San Jose, CA (US); Siu F. Cheng, Culver City, CA (US); Hang Yu, Woodland, CA (US); Chiu Chan, Foster City, CA (US); Ganesh Balasubramanian, Fremont, CA (US); Deenesh Padhi, Sunnyvale, CA (US); Juan Carlos Rocha, San Carlos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 433 days.

(21) Appl. No.: 16/259,011

(22) Filed: Jan. 28, 2019

(65) Prior Publication Data

US 2019/0153592 A1 May 23, 2019

Related U.S. Application Data

(62) Division of application No. 12/974,365, filed on Dec. 21, 2010, now Pat. No. 10,227,695.

(Continued)

(51) Int. Cl.
  *C23C 16/04* (2006.01)
  *H01J 37/32* (2006.01)
  (Continued)

(52) U.S. Cl.
  CPC .............. *C23C 16/04* (2013.01); *C23C 14/04* (2013.01); *C23C 14/042* (2013.01);
  (Continued)

(58) Field of Classification Search
  None
  See application file for complete search history.

(56) References Cited

U.S. PATENT DOCUMENTS

| 5,094,885 A | 3/1992 | Selbrede |
| 5,326,725 A | 7/1994 | Sherstinsicy et al. |

(Continued)

FOREIGN PATENT DOCUMENTS

| KR | 20010062301 A | 7/2001 |
| TW | 518690 B | 1/2003 |

OTHER PUBLICATIONS

Decision On Appeal of Patent Trial and Appeal Board dated Oct. 9, 2018 reversing the examiner in parent U.S. Appl. No. 12/974,365, which resulted in the issuance therefrom, on Mar. 12, 2019, of U.S. Pat. No. 10,227,695 B2 (duBois'695). (Year: 2018).*

(Continued)

*Primary Examiner* — Jeffrie R Lund
*Assistant Examiner* — Stanislav Antolin
(74) *Attorney, Agent, or Firm* — Patterson + Sheridan LLP

(57) ABSTRACT

Embodiments of the invention contemplate a shadow ring that provides increased or decreased and more uniform deposition on the edge of a wafer. By removing material from the top and/or bottom surfaces of the shadow ring, increased edge deposition and bevel coverage can be realized. In one embodiment, the material on the bottom surface is reduced by providing a recessed slot on the bottom surface. By increasing the amount of material of the shadow ring, the edge deposition and bevel coverage is reduced.

(Continued)

Another approach to adjusting the deposition at the edge of the wafer includes increasing or decreasing the inner diameter of the shadow ring. The material forming the shadow ring may also be varied to change the amount of deposition at the edge of the wafer.

13 Claims, 5 Drawing Sheets

Related U.S. Application Data

(60) Provisional application No. 61/291,680, filed on Dec. 31, 2009.

(51) Int. Cl.
| | |
|---|---|
| C23C 14/04 | (2006.01) |
| H01J 37/34 | (2006.01) |
| C30B 25/12 | (2006.01) |
| H01L 21/687 | (2006.01) |
| C23C 16/44 | (2006.01) |
| C23C 16/455 | (2006.01) |
| C23C 16/458 | (2006.01) |

(52) U.S. Cl.
CPC ........ *C23C 16/042* (2013.01); *C23C 16/4401* (2013.01); *C23C 16/4585* (2013.01); *C23C 16/45589* (2013.01); *C30B 25/12* (2013.01); *H01J 37/32642* (2013.01); *H01J 37/32651* (2013.01); *H01J 37/32715* (2013.01); *H01J 37/3441* (2013.01); *H01L 21/68721* (2013.01); *H01L 21/68735* (2013.01)

(56) References Cited

U.S. PATENT DOCUMENTS

| | | | |
|---|---|---|---|
| 5,328,722 | A | 7/1994 | Ghanayem et al. |
| 5,383,971 | A | 1/1995 | Selbrede |
| 5,421,401 | A | 6/1995 | Sherstinsky et al. |
| 5,447,570 | A | 9/1995 | Schmitz et al. |
| 5,476,548 | A | 12/1995 | Lei et al. |
| 5,511,799 | A | 4/1996 | Davenport et al. |
| 5,632,873 | A | 5/1997 | Stevens et al. |
| 5,810,931 | A | 9/1998 | Stevens et al. |
| 5,855,687 | A | 1/1999 | DuBois et al. |
| 5,868,847 | A | 2/1999 | Chen et al. |
| 5,888,304 | A | 3/1999 | Umotoy et al. |
| 5,983,906 | A | 11/1999 | Zhao et al. |
| 6,051,122 | A | 4/2000 | Flanigan |
| 6,073,576 | A | 6/2000 | Moslehi et al. |
| 6,102,164 | A | 8/2000 | McClintock et al. |
| 6,138,745 | A | 10/2000 | Moslehi |
| 6,168,668 | B1 | 1/2001 | Yudovsky |
| 6,223,447 | B1 | 5/2001 | Yudovsky et al. |
| 6,231,674 | B1 | 5/2001 | Chen et al. |
| 6,277,198 | B1 | 8/2001 | Yao et al. |
| 6,328,808 | B1 | 12/2001 | Tsai et al. |
| 6,350,320 | B1 | 2/2002 | Sherstinsicy et al. |
| 6,355,108 | B1 | 3/2002 | Won et al. |
| 6,374,512 | B1 | 4/2002 | Guo et al. |
| 6,375,748 | B1 | 4/2002 | Yudovsky et al. |
| 6,378,600 | B1 | 4/2002 | Moslehi |
| 6,436,192 | B2 | 8/2002 | Chen et al. |
| 6,508,885 | B1 | 1/2003 | Moslehi et al. |
| 6,511,543 | B1 | 1/2003 | Stauss et al. |
| 6,521,292 | B1 | 2/2003 | Yudovsky et al. |
| 6,544,340 | B2 | 4/2003 | Yudovsky |
| 6,555,164 | B1 | 4/2003 | Yudovsky |
| 6,589,352 | B1 | 7/2003 | Yudovsky et al. |
| 6,907,924 | B2 | 6/2005 | Moslehi |
| 7,632,356 | B2 | 12/2009 | Tomita et al. |
| 7,923,280 | B2 | 4/2011 | Koelmel et al. |
| 8,342,119 | B2 | 1/2013 | Yudovsky et al. |
| 10,227,695 | B2 * | 3/2019 | du Bois ................. C30B 25/12 |
| 2002/0069820 | A1 | 6/2002 | Yudovsky |
| 2003/0211758 | A1 | 11/2003 | Chung |
| 2004/0003780 | A1 | 1/2004 | Yudovsky et al. |
| 2005/0078953 | A1 | 4/2005 | Fodor et al. |
| 2005/0196971 | A1 | 9/2005 | Sen et al. |
| 2006/0207508 | A1 | 9/2006 | Leung |
| 2006/0207509 | A1 | 9/2006 | Tomita et al. |
| 2007/0065597 | A1 | 3/2007 | Kaido et al. |
| 2008/0072823 | A1 * | 3/2008 | Yudovsky et al. ...... C30B 31/14 118/728 |
| 2008/0152838 | A1 | 6/2008 | Sen et al. |
| 2009/0209112 | A1 | 8/2009 | Koelmel et al. |
| 2011/0159211 | A1 * | 6/2011 | du Bois ................ C23C 14/042 427/569 |
| 2019/0153592 | A1 * | 5/2019 | du Bois .............. C23C 16/4401 |

OTHER PUBLICATIONS (Continuation of "document U" above) Available May 21, 2021 online at https://developer.uspto.gov/ptab-web/#/search/documents?proceedingNumber=2017005969; also available May 21, 2021 online at https://portal.uspto.gov/pair/PublicPair. (Year: 2018).*

International Search Report and Written Opinion dated Sep. 9, 2011 for PCT International Application No. PCT/US2010/061470.

Office Action in related application TW 99145837 dated May 15, 2015.

Korean Office Action dated Jun. 7, 2019 for Application No. 10-2019-7004423.

* cited by examiner

SHADOW RING FOR MODIFYING WAFER EDGE AND BEVEL DEPOSITION

CROSS-REFERENCE TO RELATED APPLICATIONS

This application is a divisional of co-pending U.S. patent application Ser. No. 12/974,365, filed Dec. 21, 2010, which claims benefit of U.S. provisional patent application Ser. No. 61/291,680, filed Dec. 31, 2009, which both are both incorporated herein by reference.

BACKGROUND OF THE INVENTION

Field of the Invention

Embodiments of the present invention relate to shadow ring modifications that enhance or otherwise affect the deposition of process gasses on the edge and bevel of a wafer.

Description of the Related Art

Thermal and plasma enhanced chemical vapor deposition (CVD) are some of a number of processes used to deposit thin films of material on semiconductor wafers or wafers. To process wafers using thermal CVD, a vacuum chamber is provided with a substrate support configured to receive a wafer. In a typical CVD chamber, the wafer is placed into and removed from the chamber by a robot blade and is supported by a wafer support during processing. A precursor gas is delivered into the vacuum chamber through a gas manifold plate situated above the wafer, and the wafer is heated to process temperatures, generally in the range of about 250° to 650° C. The precursor gas reacts on the heated wafer surface to deposit a thin layer thereon and to form volatile byproduct gases, which are pumped away through the chamber exhaust system. In thermal CVD processes, a heater, such as an electrical resistance type heater may be used to heat the wafer. In plasma enhanced CVD (PECVD), one or more RF electrodes are provided to energize a gas to form a plasma. The heat to activate the precursors and form the thin film layer is provided by the plasma.

A primary goal of wafer processing is to obtain the largest useful surface area, and as a result the greatest number of chips, possible from each wafer. This is highlighted by the recent demands from semiconductor chip manufacturers to minimize edge exclusion on the wafers processed, so that as little of the wafer surface as possible, including the edge of the wafer, is wasted. Some important factors to consider include processing variables that affect the uniformity and thickness of the layer deposited on the wafer, and contaminants that may attach to the wafer and render all or a portion of the devices formed on the wafer defective or useless. Both of these factors should be controlled to maximize the useful surface area for each wafer processed.

One source of particle contamination in the chamber is material deposited at the edge or on the backside of the wafer that flakes off or peels off during a subsequent process. Wafer edges are typically beveled, making deposition difficult to control over these surfaces. Thus, deposition at wafer edges is typically non-uniform and, where metal is deposited, tends to adhere differently to a dielectric than to silicon. If a wafer's dielectric layer does not extend to the bevel, metal may be deposited on a silicon bevel and eventually chip or flake, generating unwanted particles in the chamber. Additionally, chemical mechanical polishing is often used to smooth the surface of a wafer coated with tungsten or other metals. The act of polishing may cause any deposits on the edge and backside surfaces to flake and generate unwanted particles.

A number of approaches have been employed to control the deposition on the edge of the wafer during processing. One approach employs a shadow ring which essentially masks or shields a portion of the perimeter of the wafer from the process gasses. One disadvantage with the shadow ring approach is that, by masking a portion of the wafer's perimeter, the shadow ring reduces the overall useful surface area of the wafer. This problem is made worse if the shadow ring is not accurately aligned with the wafer, and alignment can be difficult to achieve. Further, the shadow ring itself affects the deposition uniformity in the region of the wafer's edge by drawing heat (from both resistive and plasma type heat sources) away from the edge of the wafer.

Accordingly a need exists for an improved shadow ring which can increase edge deposition uniformity and reduce the chance of particle contamination.

SUMMARY OF THE INVENTION

Embodiments of the present invention generally provide a shadow ring for improved deposition at the edge of a wafer. Various parameters of the shadow ring are adjusted to change the heat and plasma effects produced by the shadow ring and thereby adjust the deposition of material at the edge of the wafer.

In a first embodiment, the invention is a shadow ring for shielding the edge of a wafer in a deposition process. The shadow ring includes an annular top surface and an annular bottom surface, the bottom surface having a first portion for engaging a substrate support and an annular recessed slot extending around the annular bottom surface and being a first distance above the first portion of the bottom surface.

In a further embodiment the invention is a chamber for depositing a material on a wafer. The chamber has a chamber body, a substrate support having a top surface for supporting the wafer and a shadow ring supported on the top surface of the substrate support. The shadow ring includes an annular top surface and an annular bottom surface, the bottom surface having a first portion for engaging the top surface of the substrate support and an annular recessed slot extending around the annular bottom surface and being a first distance above the first portion of the bottom surface.

In another embodiment, the invention is a method of adjusting the deposition of material at the edge of a wafer in a deposition process. The method includes providing a shadow ring, the shadow ring being formed of a material and having a top surface and a bottom surface, and varying at least one parameter of the shadow ring to affect deposition and improve deposition uniformity at the edge of the wafer.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings.

For clarity, identical reference numerals have been used, where applicable, to designate identical elements that are common between figures. It is contemplated that features of one embodiment may be incorporated in other embodiments without further recitation.

DETAILED DESCRIPTION

Embodiments of the invention contemplate a shadow ring that increases deposition uniformity at the edge of a wafer and while minimizing the deposition on unwanted regions of the surface of the wafer. Specifically, the invention includes modifications to a shadow ring that alters the deposition in the 2 mm edge exclusion area of the wafer. Embodiments of the shadow ring can provide increased or decreased deposition on the edge of a wafer by the tailoring of the shadow ring shape. Removing material from the top and/or bottom surfaces of the shadow ring can be used to increase edge deposition and bevel coverage. In one embodiment, the material on the bottom surface is reduced by providing a recessed slot on the bottom surface. Increasing the amount of material of the shadow ring reduces the amount of edge deposition and bevel coverage. Other approaches to adjusting the deposition at the edge of the wafer include increasing or decreasing the inner diameter of the shadow ring and adjusting the composition of the material forming the shadow ring. For example, the thermal conductivity of the material may be changed to affect the thermal characteristics of the shadow ring. The heat applied to the edge region of the wafer in thermal processes can thereby be controlled to affect deposition in that region. The dielectric constant of the material from which the shadow ring is made may be changed to affect the plasma coupling characteristics of the shadow ring in plasma based processes. The interaction between the plasma and the edge region of the wafer in plasma enhanced deposition processes can thereby be controlled to affect deposition in that region.

Figure 1:
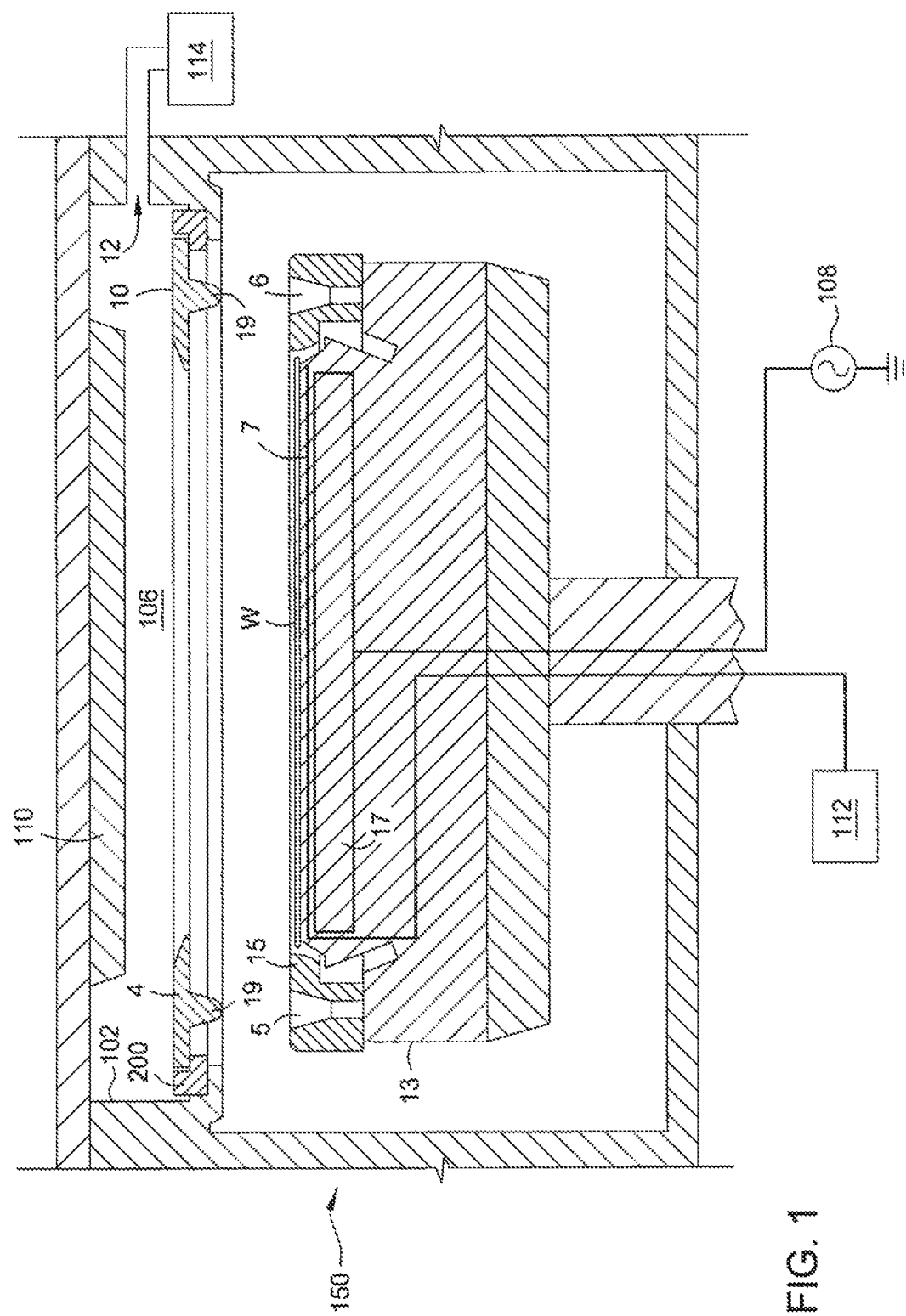
FIG. 1 is a side view of a chamber showing one embodiment of a shadow ring and a substrate support of the invention in a non-processing position.

FIG. 1 is a side cross-sectional view of a chamber 150 that has a susceptor 104 that is positioned in a lowered non-processing position within a chamber body 100. The susceptor 104 comprises a shadow ring 4, supported by a chamber body ring 200 disposed on the internal surface 102 of the processing chamber body 100 above the substrate support 13 and a second ring, such as a purge ring 15, disposed on the substrate support 13. The substrate support 13 may be made of various materials, such as aluminum and/or ceramic, and may include a heating element, such as a resistive heating coil 7 that is disposed within the substrate support 13 and is supplied electrical power from a heater power supply 112. The embodiment of the substrate support 13 in FIGS. 1 and 2, includes an RF electrode 17 that can be used to induce a plasma P in processing region 106 (see FIG. 2). The electrode 17 may be connected to an RF power supply 108 that produces an RF current between the electrode 17 and ground, which is typically the walls 100A of the processing chamber body 100. A showerhead 110 provides the necessary deposition and plasma gasses to the processing region 106 required for the deposition process. Vacuum ports 12 (one shown) may be provided and attached to a source of vacuum 114, to maintain a vacuum environment in processing region 106, depending on the deposition requirements. In one embodiment, the shadow ring 4 comprises a plurality of tapered or frustoconically shaped pins 19 (two shown), equally spaced around the perimeter of the shadow ring 4 and extending downwardly therefrom. The purge ring 15 includes at least one tapered or frustoconically shaped alignment recess 5 and at least one tapered or frustoconically shaped alignment slot 6 formed therein. Although the invention is shown and described with a shadow ring having pins thereon and a purge ring having recess/slot thereon, it is understood that invention contemplates embodiments wherein the pin and recess/slot coupling may be disposed on either the shadow ring or the purge ring. The invention also contemplates embodiments wherein either the pins or the recesses/slots include tapered surfaces. Further, while the shadow ring is shown in use with a purge ring, in some embodiments a purge ring is not required and the alignment recess 5 and slot 6 may be formed directly in the substrate support 13.

Figure 2:
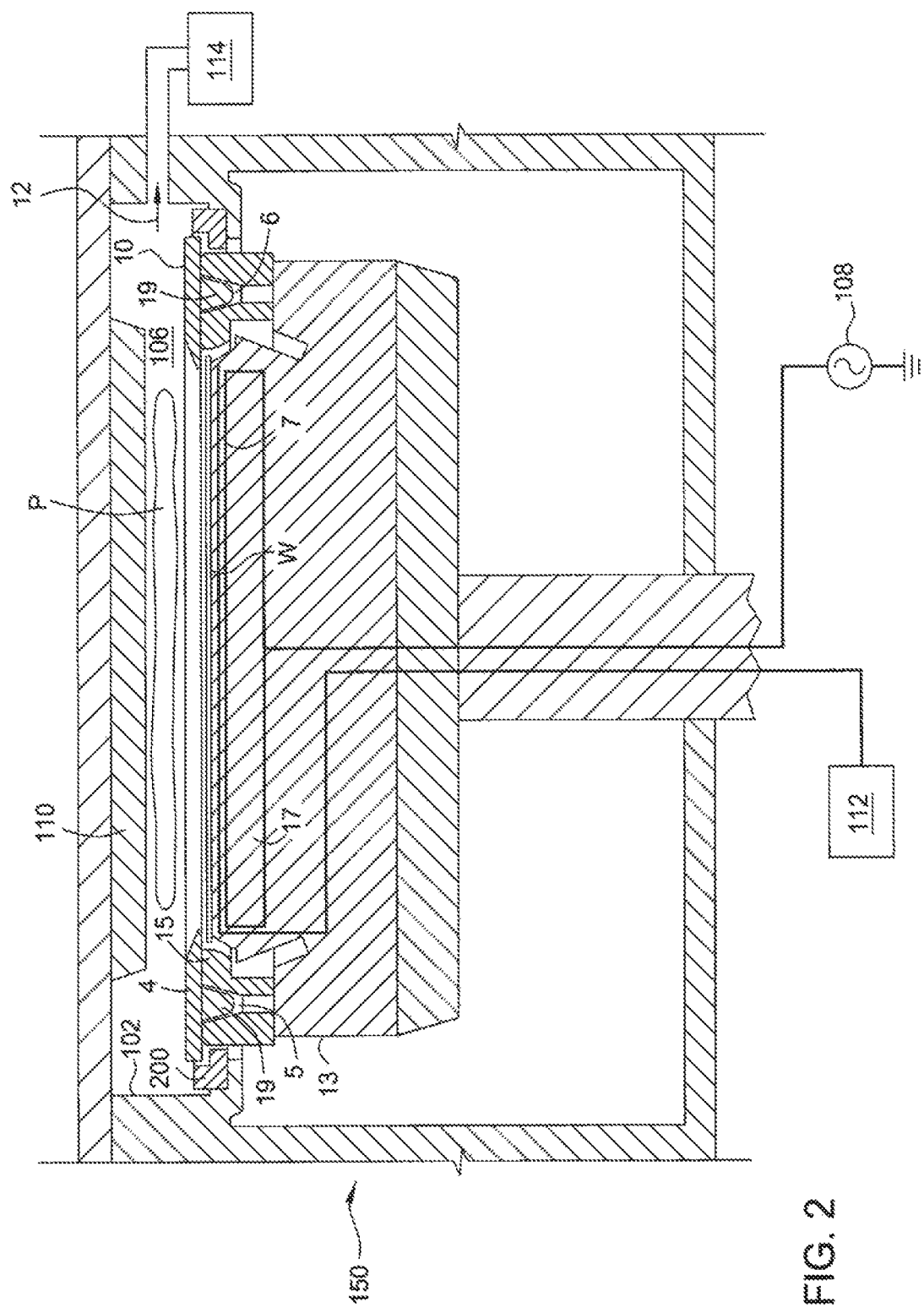
FIG. 2 is a side view of the chamber of FIG. 1 showing the shadow ring and the substrate support of the invention in a processing position.

In one embodiment, the pins 19 are positioned to interface with the alignment recess 5 and the alignment slot 6. The alignment recess 5 and the alignment slot 6 are at least as wide as a corresponding one of the plurality of pins 19. The coupling of the pins 19 with the alignment recess 5 and the alignment slot 6 restricts movement of the shadow ring 4 caused by thermal cycling induced expansion and contraction or other causes to less than the length of the alignment slot 6. The pins 19 also restrict rotational movement of the shadow ring 4 relative to the purge ring 15, thereby providing rotational alignment. The pins 19 as shown in FIGS. 1 and 2 preferably have a frustoconical shape, tapering from a base portion to a top portion. The alignment recess 5 and the alignment slot 6 have matching tapering sidewalls forming a wider opening portion and a narrower bottom portion for receiving the tapered pins 19. This configuration allows for and corrects gross misalignment between the two rings because the narrower tip portion of the pins 19 can be inserted into the wider opening portion of the recess 5 and slot 6 with a greater margin of misalignment. Thus, with frustoconically shaped or tapered pins 19 instead of non-tapering (i.e., cylindrical) pins, recess 5, and slot 6, misalignment of the shadow ring 4 with the purge ring 15, due to thermal expansion or other causes can be corrected when the pins 19 are inserted into the recess 5 and slot 6 when the shadow and purge rings are brought together. As the pins 19 are inserted into the recess 5 and slot 6, misalignment between the shadow ring and the purge ring is corrected as the surface of the pin 19 slides along the surface defined by the recess 5 or slot 6. The two rings are thus aligned when the pins 19 are fully inserted into the recess 5 and slot 6, providing an accurate positional and rotational alignment between the shadow and purge rings. The shadow ring 4 may be removed for cleaning or replacement and then accurately repositioned and realigned. Down time and the chance of wafer breakage is thereby minimized.

Figure 3:
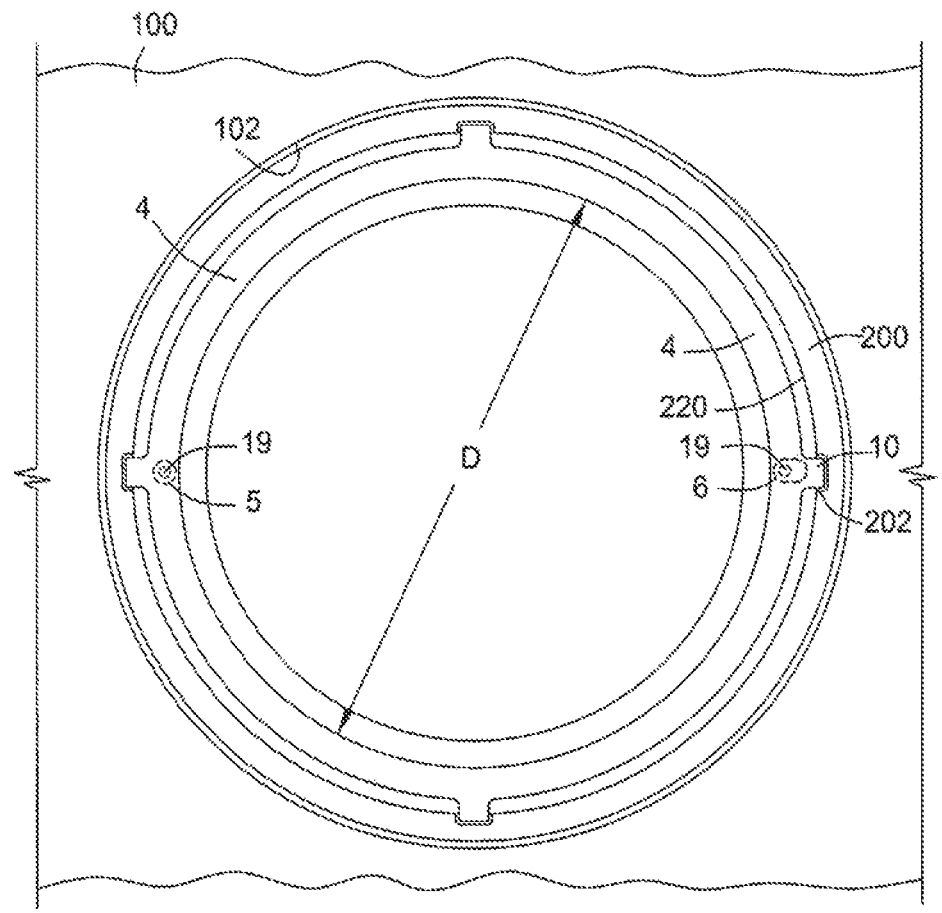
FIG. 3 is a top view of one embodiment of a shadow ring of the invention supported on a chamber body ring.

FIG. 3 is a top view of one embodiment of the shadow ring 4 supported on a chamber body ring 200. A chamber body ring 200 is coupled to the internal surface 102 of the chamber body 100. The chamber body ring 200 includes a plurality of recesses 202 formed in the upper portion of the internal surface 220 of the chamber body ring 200. The shadow ring 4 includes a plurality of projections 10 configured to rest on the surface of the chamber body ring 200 defined by the recesses 202. Preferably, four projections 10 are spaced equally along the perimeter of the shadow ring 4. When not coupled to the purge ring 15, the shadow ring 4 may be supported by the chamber body ring 200 via the projections 10 resting on the surface of the recesses 202. The recesses 202 are sized to allow for thermal expansion of the shadow ring 4, and yet keep the shadow ring 4 sufficiently aligned with the purge ring 15 so that the pins 19 stay within the capture range of the recess 5 and slot 6. The sidewall surfaces of the recess 202 may also be tapered to urge a shadow ring 4 into the desired aligned position on the chamber body ring 200.

FIG. 2 is a side cross-sectional view of a chamber showing a susceptor 104 in a processing position. As shown, the purge ring 15 coupled to the substrate support 13 contacts and lifts the shadow ring 4. The pins 19 of the shadow ring 4 are inserted into the recess 5 and slot 6 of the purge ring 15. The shadow ring 4 is thereby lifted off the chamber body ring 200, so that the projections 10 of the shadow ring 4 are lifted off the internal surface 220 of the chamber body ring 200 defined by the recesses 202. In this configuration, the shadow ring 4 is positioned about 3 to 5 millimeters above a wafer W and overhangs a portion of the perimeter, or edge, of the wafer W, controlling deposition thereon during processing. The area about the perimeter of the wafer W is sometimes referred to as the 2 mm edge exclusion. By decreasing the edge exclusion area, a greater portion of the wafer W may be deposited upon to form more useful devices on the wafer. If the edge exclusion is too small, however, bridging may occur between the wafer W and the substrate support 13, thus creating particles and/or damage to the wafer or substrate support.

In operation, the substrate support 13 is initially lowered to a wafer transfer position, as shown in FIG. 1. A wafer handler comprising a robot blade then carries a wafer into a position above the substrate support 13. Lift pins (not shown) lift the wafer W off the robot blade, and the robot blade retracts. The substrate support 13 is elevated to position the substrate thereon, and then the substrate support 13 further elevates so that the purge ring 15 attached thereto lifts the shadow ring 4 off the chamber body ring 200 and into the processing position, as shown in FIG. 2. As the purge ring 15 engages the shadow ring 4, the pins 19 are inserted into the alignment recess 5 and alignment slot 6. The tapered surfaces of the pins 19 slides along the tapered surfaces of the alignment recess 5 and alignment slot 6, urging the shadow ring 4 into desired alignment with the purge ring 15. Once the wafer W is in the processing position, precursor gasses are fed into the chamber processing region 106 and heat is provided by the heater 110, or by plasma formed using an inert and/or precursor gas and the RF electrode 17.

Figure 4:
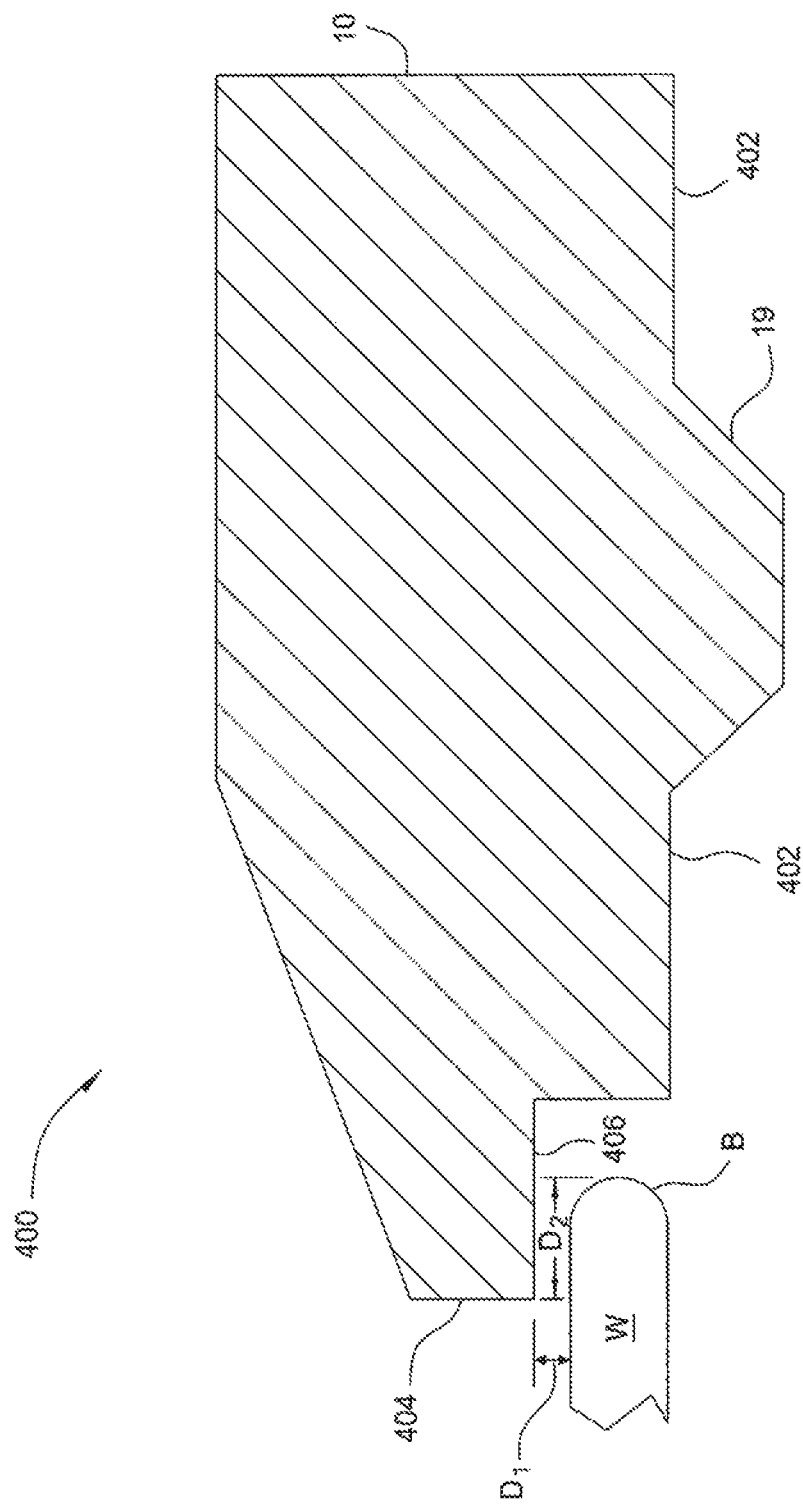
FIG. 4 is a cross section through the pin area of a further embodiment of the shadow ring of FIG. 3.

In FIG. 4 is a cross section view of a shadow ring 400 according to one embodiment of the invention. The shadow ring 400, in one embodiment, is shadow ring 4, described above with reference to FIGS. 1-3. The bottom surface 402 of this embodiment of the shadow ring 400 is substantially planar. Pin 19 extends downward from the bottom surface 402, and projection 10 extends from the outer perimeter of the shadow ring for alignment purposes as described above with reference to the shadow ring 4 discussed in conjunction with FIG. 3. The bottom surface of the projection 10 is substantially coplanar with the remainder of the bottom surface 402 of the shadow ring 400. An annular lip 404 extends around the inner perimeter of the shadow ring 400. The lip 404 has a bottom surface 406 that is at a distance $D_1$ above the top surface of the wafer W. In one embodiment, distance $D_1$ is between about 0 mm (contacting the wafer W) and about 0.762 mm (0.030"). In one embodiment, the bottom surface 402 of the shadow ring 400, is supported by the top surface of the substrate support 13 or the top surface of the purge ring 15 when included (see FIG. 2). The lip 404 overhangs the edge or bevel B of the wafer W by a distance $D_2$. In one embodiment, the distance $D_2$ is between about 0.1 mm and about 1.5 mm.

Figure 5:
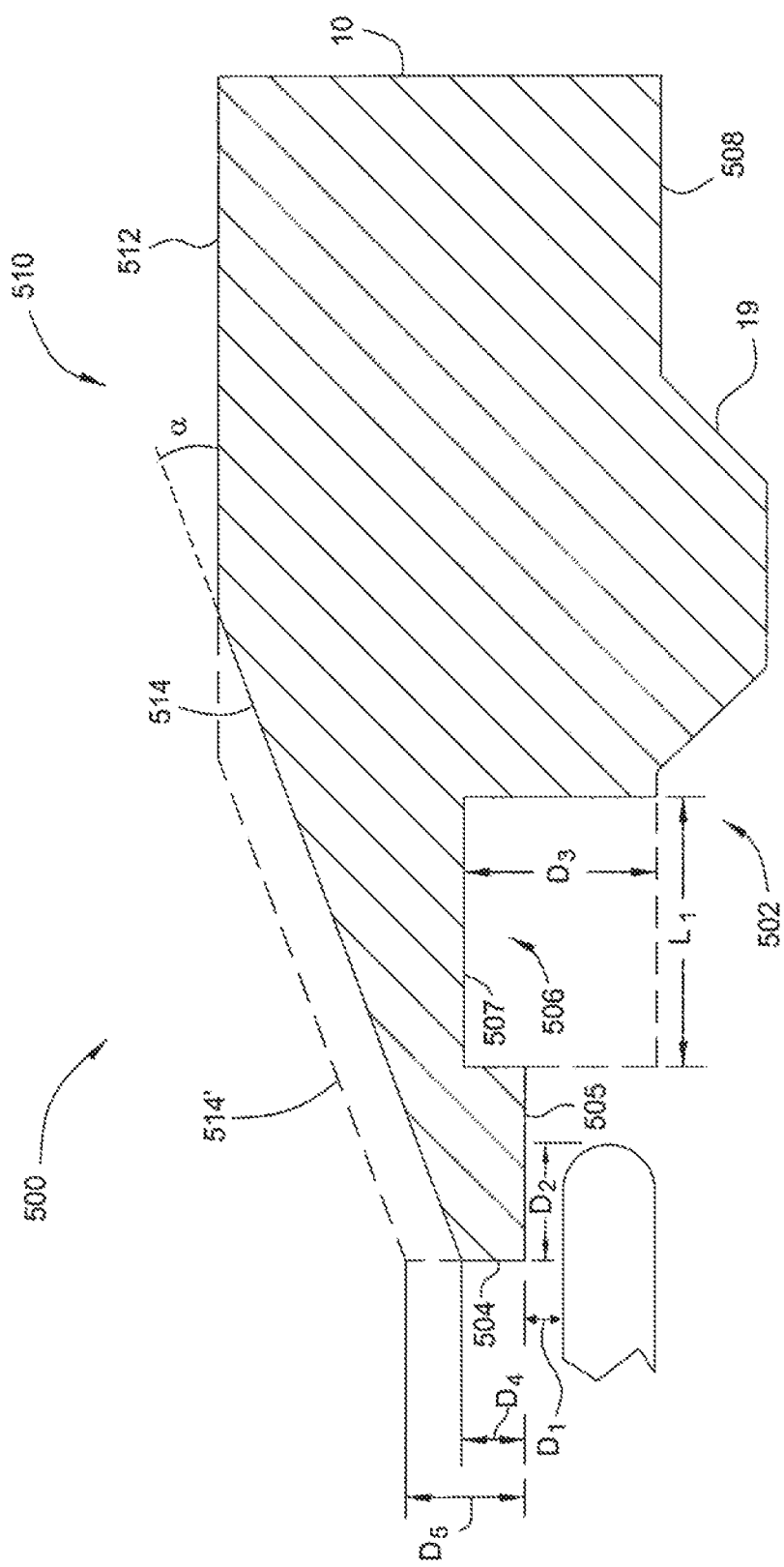
FIG. 5 is a cross section through the pin area of further embodiments of the shadow ring of FIG. 3.

FIG. 5 is a cross section view of a shadow ring 500 according to further embodiments of the invention. The shadow ring 500, in one embodiment, is shadow ring 4, described above with reference to FIGS. 1-3. The shadow ring 500 includes an annular lip 504 that extends around the inner perimeter of the shadow ring, similar to the lip 404 of the shadow ring 400. Pin 19 depends downward from the bottom surface 502, and projection 10 extends from the outer perimeter of the shadow ring 500, for alignment purposes as described above with reference to shadow ring 4. In one embodiment, the bottom surface 502 of the shadow ring 500 includes an annular recessed slot 506 that extends around the shadow ring 500. As is shown in FIG. 5, a portion 508 of the bottom surface 502 is not recessed in the region of pin 19 and projection 10. The portion 508 engages with the top surface of the substrate support 13, or the top surface of the purge ring 15 when included, as described above, and provides the proper position of shadow ring 500.

The recessed slot 506 provides a reduction of the material of the shadow ring 500 on the bottom surface 502, which faces the RF electrode 17 and/or the heating element 7 in the substrate support 13. By reducing the amount of material in this area, the thermal and plasma coupling characteristics are changed. It has been found that the addition of the recessed slot 506 will result in increased deposition at the bevel of the wafer W and increased film thickness at the edge of the wafer W. The lip 504 has a bottom surface 505 that is at a distance $D_1$ above the top surface of the wafer W. In one embodiment, distance $D_1$ is between about 0 mm (contacting the wafer W) and about 0.762 mm (0.030"). The lip 504 overhangs the edge or bevel B of the wafer W by a distance $D_2$. In one embodiment, the distance $D_2$ is between about 0.1 mm and about 1.5 mm. As can be seen in FIG. 5, the recessed slot 506 has a top surface 507 that is at a distance or depth $D_3$ above the bottom surface 502 of the shadow ring 500. In one embodiment, the distance $D_3$ is between 0 mm (as with shadow ring 400) and can be almost the entire thickness of the shadow ring 500. The recessed slot 506 extends a radial length of $L_1$. In one embodiment, the radial length $L_1$ of the recessed slot 506 is between about 0.254 mm (0.10") and can extend to near the outer diameter of the shadow ring 500. In some embodiments, the recessed slot 506 extends across the entire bottom surface 502 in the areas not adjacent to pins 19. In other embodiments, the bottom surface 502 may be even with portion 508 in the area of the outer perimeter of shadow ring 500, to provide support for the shadow ring around the outer perimeter thereof.

It has been found that another approach to modifying the deposition and improving uniformity at the edge of the wafer, is by changing the amount of material on the top surface of the shadow ring. By adjusting the amount of material of the shadow ring, as shown in FIG. 5, the deposition and thermal uniformity across the wafer during a deposition process can be adjusted. While not wishing to be bound by theory, it is believed that the reduction in material affects the deposition on the edge of the wafer by at least three processes. First, the reduction of material decreases the physical "shadowing" of the area, allowing deposition products to reach areas beneath the shadow ring. Second, the reduction of material decreases the heat sink effect caused by the shadow ring, allowing the edge of the wafer to be heated more uniformly with respect to inner portions of the wafer. Third, the dielectric constant of the material of the shadow ring is significantly higher (8.9 for AlN) than that of the vacuum or gas (close to 1.0) that occupies the space where the removed material was located. The decrease in the overall dielectric constant of the space over the edge of the wafer allows greater coupling of the plasma, such that higher deposition rates can be achieved in the edge region of the wafer.

The shadow ring 500 in FIG. 5, in some embodiments, includes various modifications of the top surface of the shadow rings. The top surface 510 of shadow ring 500, includes a first, outer annular portion 512 that extends from the outer perimeter of the shadow ring 500 and over the top of the projections 10. In one embodiment, the first, outer annular portion 512 is relatively horizontal. The top surface 510 of shadow ring 500, in some embodiments, also includes a second, inner annular portion 514 that extends from the outer annular portion 512 to the annular lip 504 of the shadow ring 500. The inner annular portion 514 forms an angle α with the outer annular portion 512, such that the top surface 510 slopes downward toward the annular lip 504. In one embodiment the angle α is between about 5° and about 60°.

FIG. 5 also shows a modified top surface 510 of shadow ring 500. In this embodiment, the inner annular portion 514 has an increased thickness as shown by dotted line 514'. The additional material (above 514), in this embodiment of the shadow ring 500 increases the profile thickness of the shadow ring at the annular lip 504 from a first thickness $D_4$ to a second thickness $D_5$. In one embodiment, the first thickness $D_4$ is between about 0.127 mm (0.005") and about 0.254 mm (0.010") and the second thickness $D_4$ is also between about 0.127 mm (0.005") and about 0.254 mm (0.010"). By increasing the amount of material of the shadow ring 500 in the area of the annular lip 504, the amount of edge deposition and bevel coverage can be reduced, when desired. The overall thickness of the various embodiments of the shadow ring 500 may be the same, or may also be varied to affect the deposition process.

Further embodiments of the invention, include varying other shadow ring parameters to affect deposition and improve deposition uniformity in the edge exclusion area are also contemplated. Referring to FIG. 3, a further embodiment of the invention is described, although it should be understood that the below-described features may be used with any of the various shadow ring embodiments described herein. The inner diameter of the inner perimeter of the shadow ring 500 is shown as D. By increasing the diameter D, the edge exclusion area can be decreased from 2 mm to 0.8 mm. Conversely, decreasing the diameter D increases shadow ring coverage on the edge of the wafer and increases the area of the edge exclusion to beyond 2 mm from the edge of the wafer. Referring to FIG. 4 or 5, adjusting the diameter D of the various embodiments of the shadow ring also adjusts the radial overhang length $D_2$ of the various embodiments of the shadow ring as described above with respect to embodiments 400 and 500 of the shadow ring.

Another approach to affecting the deposition characteristics of the shadow ring, according to embodiments of the invention, is by modifying the composition of the material of the shadow ring. In some embodiments, the above shadow rings may be formed of a thermally conductive dielectric material such as aluminum nitride. By changing the material of the shadow ring, more or less edge deposition and bevel coverage may be achieved. As described above, while not wishing to be bound by theory, it is believed that changes in the thermal conductivity k and electrical characteristics (i.e. dielectric constant), of the composition of the material of the shadow ring, affect the deposition uniformity and rate in the edge area of the wafer below and adjacent to the shadow ring.

While the foregoing is directed to embodiments of the present invention, other and further embodiments of the invention may be devised without departing from the basic scope thereof, and the scope thereof is determined by the claims that follow.

What is claimed is:

1. A method of forming a shadow ring for use in a deposition chamber, the method comprising:
   forming an annular body having a top surface and a bottom surface, the bottom surface including a first annular bottom surface and a second annular bottom surface, wherein the second annular bottom surface is disposed in a recessed slot located inwardly relative to the first annular bottom surface, the second annular bottom surface located a first distance above the first annular bottom surface;
   forming at least one pin member extending from the first annular bottom surface; and
   forming an annular lip extending inwardly relative to the recessed slot and the first annular bottom surface, wherein the annular lip has a third annular bottom surface located a second distance above the first annular bottom surface, the second distance less than the first distance, and wherein the recessed slot is formed between the pin member and the annular lip.

2. The method of claim 1, wherein the at least one pin member has tapered sides.

3. The method of claim 1, wherein the at least one pin member is frustoconically shaped.

4. The method of claim 1, wherein the recessed slot has a width of about 0.254 mm or greater.

5. The method of claim 1, further comprising:
   forming one or more projections positioned on an outer diameter of the annular body; and
   forming a vertical surface connecting the third annular bottom surface of the annular lip to the second annular bottom surface disposed in the recessed slot.

6. The method of claim 1, wherein the shadow ring is made of a material comprising aluminum nitride.

7. The method of claim 1, wherein the recessed slot has a first sidewall having a first length as measured from the first annular bottom surface to the second annular bottom surface and a second sidewall having a second length as measured from the third annular bottom surface to the second annular bottom surface, wherein the second length is less than the first length.

8. A method of forming a shadow ring for use in a deposition chamber, the method of forming the shadow ring comprising:
   forming a first annular bottom surface for supporting the shadow ring in the chamber body;
   forming at least one pin member extending from the first annular bottom surface;
   forming a second annular bottom surface disposed in a recessed slot located inwardly relative to the first annular bottom surface, the second annular bottom surface located a first distance above the first annular bottom surface; and
   forming an annular lip extending inwardly relative to the recessed slot, wherein the annular lip has a third annular bottom surface located a second distance above the first annular bottom surface, the second distance less than the first distance, and wherein the recessed slot is formed between the pin member and the annular lip.

9. The method of claim 8, further comprising forming a vertical surface connecting the third annular bottom surface of the annular lip to the second annular bottom surface disposed in the recessed slot.

10. The method of claim 8, wherein the at least one pin member has tapered sides.

11. The method of claim 8, wherein the at least one pin member is frustoconically shaped.

12. The method of claim 8, wherein the shadow ring is made of a material comprising aluminum nitride.

13. The method of claim 8, wherein the recessed slot has a first sidewall having a first length as measured from the first annular bottom surface to the second annular bottom surface and a second sidewall having a second length as measured from the third annular bottom surface to the second annular bottom surface, wherein the second length is less than the first length.

* * * * *